(12) United States Patent
Darveaux et al.

(10) Patent No.: US 8,207,022 B1
(45) Date of Patent: Jun. 26, 2012

(54) EXPOSED DIE OVERMOLDED FLIP CHIP PACKAGE METHOD

(75) Inventors: Robert Francis Darveaux, Higley, AZ (US); Michael Barrow, Chandler, AZ (US); Miguel Angel Jimarez, Gilbert, AZ (US); Jae Dong Kim, Seoul (KR); Dae Keun Park, Seoul (KR); Ki Wook Lee, Seoul (KR); Ju Hoon Yoon, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/931,326

(22) Filed: Jan. 27, 2011

Related U.S. Application Data

(63) Continuation of application No. 11/592,889, filed on Nov. 2, 2006, now Pat. No. 7,898,093.

(51) Int. Cl.
*B29C 31/00* (2006.01)
*H01L 23/29* (2006.01)

(52) U.S. Cl. ........ 438/127; 257/678; 257/706; 257/712; 257/730; 257/E23.116; 257/E23.123; 257/E23.129; 257/E23.18; 257/E23.181; 257/E21.502; 257/E21.503; 257/E21.504; 438/106; 438/108; 438/125; 438/126

(58) Field of Classification Search .................. 257/678, 257/706, 712, 730, E23.116, E23.123, E23.129, 257/E23.18, E23.181, E21.502, E21.503, 257/E21.504; 438/106, 108, 125, 126, 127
See application file for complete search history.

(56) References Cited

U.S. PATENT DOCUMENTS

| | | |
|---|---|---|
| 5,450,283 A | 9/1995 | Lin et al. |
| 5,510,956 A | 4/1996 | Suzuki |
| 5,969,947 A | 10/1999 | Johnson et al. |
| 6,038,136 A | 3/2000 | Weber |
| 6,194,250 B1 | 2/2001 | Melton et al. |
| 6,338,985 B1 | 1/2002 | Greenwood |
| 6,451,625 B1 | 9/2002 | Pu et al. |
| 6,730,857 B2 | 5/2004 | Konrad et al. |
| 6,740,964 B2 | 5/2004 | Sasaki |

(Continued)

OTHER PUBLICATIONS

Beijer et al., "Warpage minimization of the HVQFN map mould", *6th Int. Conf. on Thermal, Mechanical and Multiphysics Simulation and Experiments in Micro-Electronics and Micro-Systems*, IEEE, 2005, pp. 1-7.
Kim et al., "Application of Through Mold Via (TMV) as PoP base package", *58th ECTC Proceedings*, May 2008, Lake Buena Vista, FL, 6 pages, IEEE.

(Continued)

*Primary Examiner* — Eugene Lee
*Assistant Examiner* — Peniel M Gumedzoe
(74) *Attorney, Agent, or Firm* — McKay and Hodgson, LLP; Serge J. Hodgson

(57) ABSTRACT

An exposed die overmolded flip chip package includes a substrate. A die is flip chip mounted to an upper surface of the substrate. The package further includes a mold cap filling a space between an active surface of the die and the upper surface of the substrate. The mold cap includes a principal surface, sidewalls extending from the upper surface of the substrate to the principal surface, an annular surface coplanar with the inactive surface of the die and extending outward from a peripheral edge of the inactive surface of the die, and protruding surfaces extending between the principal surface and the annular surface. The mold cap does not cover the inactive surface of the die such that heat transfer from the die to the ambient environment is maximized and the package thickness is minimized.

20 Claims, 9 Drawing Sheets

U.S. PATENT DOCUMENTS

| | | |
|---|---|---|
| 6,919,514 B2 | 7/2005 | Konrad et al. |
| 7,242,081 B1 | 7/2007 | Lee |
| 7,345,361 B2 | 3/2008 | Mallik et al. |
| 7,372,151 B1 | 5/2008 | Fan et al. |
| 2002/0017738 A1 | 2/2002 | Miyajima |
| 2003/0168749 A1 | 9/2003 | Koike |
| 2004/0262776 A1 | 12/2004 | Lebonheur et al. |
| 2005/0156311 A1 | 7/2005 | Hashimoto |
| 2005/0287707 A1 | 12/2005 | Lin et al. |
| 2005/0287713 A1 | 12/2005 | Lin et al. |
| 2006/0103014 A1* | 5/2006 | Huang et al. .......... 257/712 |
| 2007/0273049 A1 | 11/2007 | Khan et al. |
| 2007/0290376 A1 | 12/2007 | Zhao et al. |
| 2008/0230887 A1 | 9/2008 | Sun et al. |

OTHER PUBLICATIONS

Ko et al., "Warpage behavior of LOC-TSOP Memory Package", *Journal of Materials Science: Materials in Electronics 12*, Kluwer Academic Publishers, 2001, pp. 93-97.

Scanlan, "Package-on-package (PoP) with Through-mold Vias", *Advanced Packaging*, Jan. 2008, 3 pages, vol. 17, Issue 1, PennWell Corporation.

Yip et al., "Package Warpage Evaluation for High Performance PQFP", IEEE, 1995, pp. 229-233.

Darveaux et al., "Exposed Die Overmolded Flip Chip Package and Fabrication Method", U.S. Appl. No. 11/592,889, filed Nov. 2, 2006.

Berry et al., "Thin Stacked Interposer Package", U.S. Appl. No. 11/865,617, filed Oct. 1, 2007.

\* cited by examiner

US 8,207,022 B1

EXPOSED DIE OVERMOLDED FLIP CHIP PACKAGE METHOD

This application is a continuation of Darveaux et al., U.S. patent application Ser. No. 11/592,889, filed on Nov. 2, 2006, entitled "EXPOSED DIE OVERMOLDED FLIP CHIP PACKAGE AND FABRICATION METHOD", now U.S. Pat. No. 7,898,093, issued on Mar. 1, 2011, which is herein incorporated by reference in its entirety.

BACKGROUND OF THE INVENTION

1. Field of the Invention

The present invention relates generally to the packaging of electronic components. More particularly, the present invention relates to an overmolded flip chip package and method for fabricating the same.

2. Description of the Related Art

A conventional flip chip package includes an integrated circuit die flip chip mounted to a substrate with solder bumps. After mounting of the integrated circuit die to the substrate, an underfill material is typically applied around the solder bumps and between the active surface of the integrated circuit die and the substrate. The integrated circuit die is then enclosed in epoxy molding compound (EMC), sometimes called overmolded.

However, the epoxy molding compound over the integrated circuit die increases the overall height of the flip chip package as well as impedes heat transfer from the integrated circuit die.

SUMMARY OF THE INVENTION

In accordance with one embodiment, an exposed die overmolded flip chip package includes a substrate having an upper surface and a lower surface opposite the upper surface. A die is flip chip mounted to the upper surface of the substrate. The die includes an active surface, an inactive surface opposite the active surface, and bond pads on the active surface.

The package further includes a mold cap filling a space between the active surface of the die and the upper surface of the substrate. The mold cap includes a principal surface, sidewalls extending from the upper surface of the substrate to the principal surface, an annular surface coplanar with the inactive surface of the die and extending outward from a peripheral edge of the inactive surface of the die, and protruding surfaces extending between the principal surface and the annular surface.

The mold cap does not cover the inactive surface of the die. Accordingly, the exposed flip chip overmolded die package is thinner than an overmolded die package in which the epoxy molding compound covers the die. Further, by exposing the inactive surface of the die to the ambient environment, heat transfer from the die to the ambient environment is maximized.

The protruding surfaces, annular surface of the mold cap and inactive surface of the die collectively define a pedestal structure that protrudes from the principal surface away from the substrate. The pedestal structure allows a very controlled bond line thickness (BLT) for thermal interface material (TIM) dispense and lid/heat sink attach by producing the inactive surface of the die above the principal surface of the mold cap.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
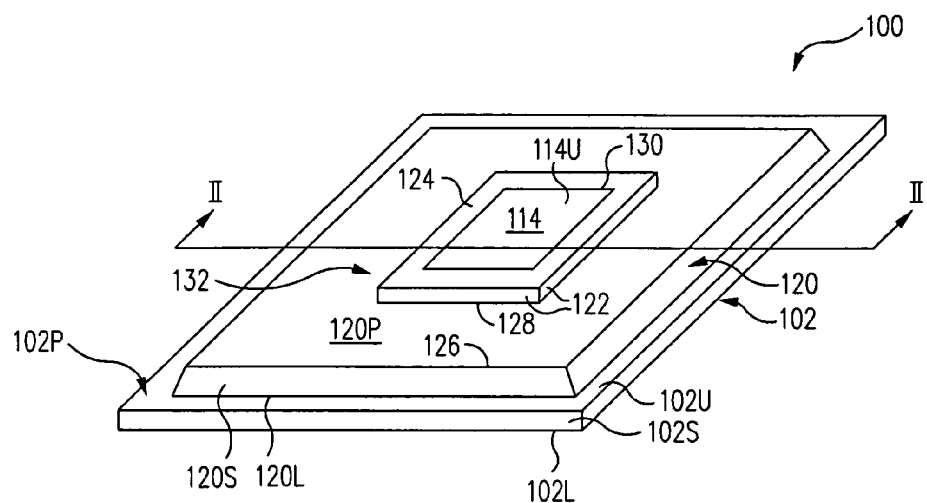
FIG. 1 is a perspective view of an exposed die overmolded flip chip package in accordance with one embodiment of the present invention.
Figure 2:
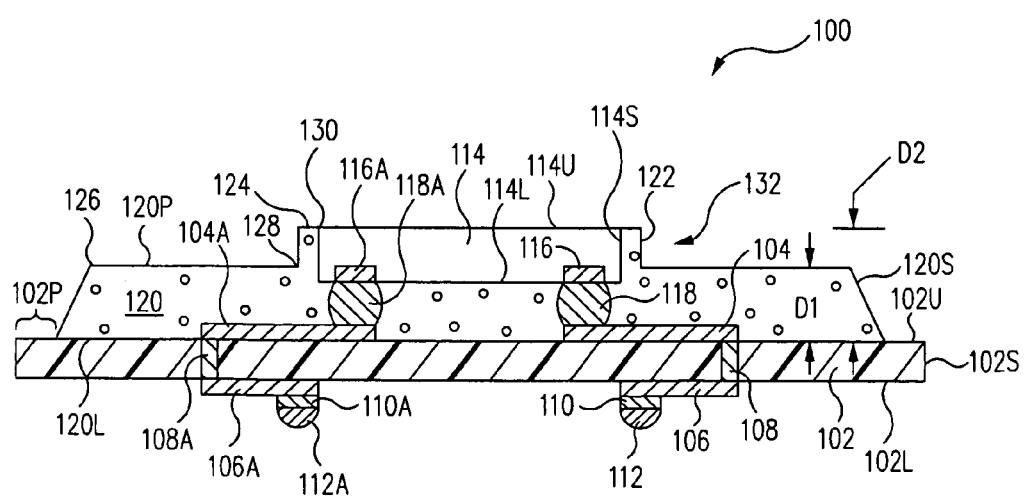
FIG. 2 is a cross-sectional view of the exposed die overmolded flip chip package along the line II-II of FIG. 1.

In accordance with one embodiment, referring to FIGS. 1 and 2 together, an exposed die overmolded flip chip package 100 includes a substrate 102 having an upper surface 102U and a lower surface 102L. A die 114 is flip chip mounted to upper surface 102U of substrate 102 by flip chip bumps 118. Die 114 includes an active surface 114L, an inactive surface 114U, and bond pads 116 on active surface 114L.

Package 100 further includes a mold cap 120 filling a space between active surface 114L of die 114 and upper surface 102U of substrate 102. Mold cap 120 includes a principal surface 120P, sidewalls 120S extending from upper surface 102U of substrate 102 to principal surface 120P, an annular surface 124 coplanar with inactive surface 114U of die 114 and extending outward from a peripheral edge 130 of inactive surface 114U of die 114, and protruding surfaces 122 extending between principal surface 120P and annular surface 124.

Mold cap 120 does not cover inactive surface 114U of die 114. Accordingly, exposed flip chip overmolded die package 100 is thinner than an overmolded die package in which the epoxy molding compound covers the die. Further, by exposing inactive surface 114U of die 114 to the ambient environment, heat transfer from die 114 to the ambient environment is maximized.

Protruding surfaces 122, annular surface 124 of mold cap 120 and inactive surface 114U of die 114 collectively define a pedestal structure 132 that protrudes from principal surface 120P away from substrate 102. Pedestal structure 132 allows a very controlled bond line thickness (BLT) for thermal interface material (TIM) dispense and lid/heat sink attach by producing inactive surface 114U of die 114 above principal surface 120P of mold cap 120.

More particularly, FIG. 1 is a perspective view of an exposed die overmolded flip chip package 100 in accordance with one embodiment of the present invention. FIG. 2 is a cross-sectional view of exposed die overmolded flip chip package 100 along the line II-II of FIG. 1.

Referring now to FIGS. 1 and 2 together, exposed die overmolded flip chip package 100 includes a substrate 102. Substrate 102 includes an upper, e.g., first, surface 102U and a lower, e.g., second, surface 102L, opposite upper surface 102U, and sides 102S extending perpendicularly between upper surface 102U and lower surface 102L.

Formed on upper surface 102U of substrate 102 are a plurality of electrically conductive upper, e.g., first, traces 104, which include a first upper trace 104A. Formed on lower surface 102L of substrate 102 are a plurality of electrically conductive lower, e.g., second, traces 106, which include a first lower trace 106A.

Extending through substrate 102 from lower surface 102L to upper surface 102U are a plurality of electrically conductive vias 108, which includes a first via 108A. Lower traces 106 are electrically connected to upper traces 104 by vias 108. To illustrate, upper trace 104A is electrically connected to lower trace 106A by via 108A. The other upper traces 104 are electrically connected to the other lower traces 106 by vias 108 in a similar manner and so are not discussed further.

Upper and lower surfaces 102U, 102L of substrate 102 may include an outermost insulative cover coat, e.g., an epoxy based resin, through which electrically conductive bond fingers and lands, e.g., the end portions, of upper traces 104 and lower traces 106 are exposed.

Formed on lower traces 106 are electrically conductive pads 110, which includes a first pad 110A. To illustrate, pad 110A is formed on lower trace 106A. Formed on pads 110 are electrically conductive interconnection balls 112, e.g., solder. To illustrate, a first interconnection ball 112A of the plurality of interconnection balls 112 is formed on pad 110A. Interconnection balls 112 are used to connect exposed die overmolded flip chip package 100 to a larger substrate such as a printed circuit mother board or another electronic component package.

Although a particular electrically conductive pathway between upper traces 104 and interconnection balls 112 is described above, other electrically conductive pathways can be formed. For example, contact metallizations can be formed between the various electrical conductors. Alternatively, pads 110 are not formed and interconnection balls 112 are formed directly on lower traces 106.

Further, instead of straight though vias 108, in one embodiment, substrate 102 is a multilayer laminate substrate and a plurality of vias and/or internal traces form the electrical interconnection between traces 104 and 106.

In yet another embodiment, interconnection balls 112 are distributed in an array format to form a ball grid array (BGA) type package. Alternatively, interconnection balls 112 are not formed, e.g., to form a metal land grid array (LGA) type package. In yet another alternative, pads 110/interconnection balls 112 are not formed, e.g., to form a leadless chip carrier (LCC) type package. In another embodiment, exposed die overmolded flip chip package 100 is inserted into a socket that is pre-mounted on the larger substrate, e.g., on the printed circuit mother board. In another embodiment, instead of interconnection balls 112, pins are provided, e.g., to form a pin grid array (PGA), and generally a pin interconnect package such as a PGA, SCI, CCGA, wire, compliant spring, etc. package is formed. BGA, LGA, PGA, and LCC type packages are well known to those of skill in the art.

In another embodiment, a flex connector, sometimes called an edge connector or flex strip, is electrically connected to lower traces 106, e.g., for applications where exposed die overmolded flip chip package 100 is remote from the larger substrate. Other electrically conductive pathway modifications will be obvious to those of skill in the art.

Referring still to FIGS. 1 and 2 together, mounted to upper surface 102U of substrate 102 is a die 114. Although only a single die 114 is illustrated and discussed below, in light of this disclosure, those of skill in the art will understand that other electronic components, e.g., passive components, are mounted to substrate 102 in other embodiments (see FIGS. 10, 11, 12, 13, 14 for example).

Die 114, generally an electronic component, is a semiconductor die, sometimes called an integrated circuit chip or an active component. However, in other embodiments, die 114 is another type of electronic component such as a passive component, e.g., a resistor, capacitor or inductor.

Die 114 includes an active, e.g., first, surface 114L, an inactive, e.g., second, surface 114U opposite active surface 114L, and sides 114S extending perpendicularly between active surface 114L and inactive surface 114U. Die 114 further includes bond pads 116, which include a first bond pad 116A, on active surface 114L of die 114. Active surface 114L, inactive surface 114U, upper surface 102U, lower surface 102L are parallel to one another. Although various structures may be described as being parallel or perpendicular, it is understood that the structures may not be exactly parallel or perpendicular but only substantially parallel or perpendicular to within accepted manufacturing tolerances.

Die 114 is flip chip mounted to substrate 102 by electrically conductive flip chip bumps 118, which include a first flip chip bump 118A. More particularly, flip chip bumps 118 electrically and physically connected bond pads 116 to upper traces 104 thus physically and electrically connecting die 114 to substrate 102. To illustrate, bond pad 116A is electrically and physically connected to upper trace 104A by flip chip bump 118A. In one embodiment, flip chip bumps 118 are solder bumps.

Die 114 is overmolded in mold cap 120, e.g., formed of epoxy molding compound (EMC) or, more generally, mold compound such as epoxy, single or multifunctional aromatic, etc., mold compound. Mold cap 120 fills the space between active surface 114L and upper surface 102U of substrate 102 and encloses flip chip bumps 118. Accordingly, mold cap 120 minimizes stress on flip chip bumps 118, e.g., stress due to differential thermal expansion between die 114 and substrate 102, sometimes called a mismatch in the thermal coefficients of expansion (TCEs) of die 114 and substrate 102. Further, mold cap 120 physically mounts die 114 to substrate 102 further minimizing stress on flip chip bumps 118. Further, mold cap 120 protects flip chip bumps 118 from the ambient environment, e.g., from moisture and the associated corrosion of flip chip bumps 118. Accordingly, mold cap 120 enhances the reliability of flip chip bumps 118 and generally the reliability of exposed die overmolded flip chip package 100.

Mold cap 120 encloses most if not all of upper surface 102U of substrate 102. In accordance with this embodiment, a periphery 102P of upper surface 102U adjacent sides 102S of substrate 102 is uncovered (not covered) by mold cap 120 and exposed and the remaining central portion of upper surface 102U of substrate is enclosed within mold cap 120. More generally, a lower surface 120L of mold cap 120 is mounted to upper surface 102U of substrate 102.

In one embodiment, mold cap 120 is formed using a molding process. Illustratively, die 114 is flip chip mounted to substrate 102 by flip chip bumps 118. Illustratively, the following assembly process is used: 1) die attach; 2) reflow; 3) an optional aqueous clean; 4) pre-bake; 5) an optional plasma clean.

Substrate 102, e.g., from a carrier tray, including flip chip mounted die 114 is then placed in a mold, e.g., a baseplate holder of the mold, and an upper mold half of the mold is moved to press at a clamping pressure on inactive surface 114U of die 114. Epoxy molding compound is transferred into the mold to form mold cap 120, e.g., using vacuum assisted molding. Exposed die flip chip package 100 is then removed from the mold. Accordingly, lower surface 120L of mold cap 120 self-adheres to upper surface 102U of substrate 102.

Mold cap 120 further includes sidewalls 120S, a principal, e.g., upper, surface 120P, protruding surfaces 122, and an annular surface 124. Principal surface 120P is parallel to upper surface 102U of substrate 102. In accordance with this embodiment, principal surface 120P of mold cap 120 is spaced a first distance D1 from upper surface 102U of substrate 102. Further, inactive surface 114U of die 114 is spaced a second distance D2 from upper surface 102U of substrate 102. Distance D2 of inactive surface 114U from upper surface 102U is greater than distance D1 of principal surface 120P from upper surface 102U, i.e., inactive surface 114U is at a greater height from upper surface 102U of substrate 102 than principal surface 120P.

Sidewalls 120S of mold cap 120 extend from upper surface 102U to principal surface 120P. In accordance with this embodiment, sidewalls 120S slant inwards from upper surface 102U of substrate 102. However, in other embodiments, sidewalls 120S are perpendicular or slant outwards from upper surface 102U of substrate 102.

Principal surface 120P extends inwards from sidewalls 120S to protruding surfaces 122 of mold cap 120. Principal surface 120P is a rectangular annulus in accordance with this embodiment. More particularly, sidewalls 120S are at an outer peripheral edge 126 of principal surface 120P and protruding surfaces 122 are at an inner peripheral edge 128 of principal surface 120P.

Protruding surfaces 122 extend from principal surface 120P perpendicularly upward and away from substrate 102. More particularly, protruding surfaces 122 extend perpendicularly between principal surface 120P and annular surface 124. Although protruding surfaces 122 are perpendicular to principal surface 120P and annular surface 124 in accordance with this embodiment, in other embodiments, protruding surfaces 122 slant inward or outward from principal surface 120P.

Annular surface 124 is coplanar, i.e., lies in a common plane, with inactive surface 114U of die 114. More particular, annular surface 124 is spaced apart by distance D2 from upper surface 102U of substrate 102.

In accordance with this embodiment, annular surface 124 is a rectangular annulus extending outward from a peripheral edge 130 of inactive surface 114U of die 114. Accordingly, mold cap 120 does not cover inactive surface 114U of die 114. Stated another way, inactive surface 114U of die 114 is exposed from mold cap 120.

Accordingly, exposed flip chip overmolded die package 100 has a minimum thickness equal to the thickness of substrate 102 plus the height (distance D2) of die 114 above substrate 102. State another way, exposed flip chip overmolded die package 100 is thinner than an overmolded die package in which the epoxy molding compound covers the integrated circuit die.

Further, by exposing inactive surface 114U to the ambient environment, heat transfer from die 114 to the ambient environment is maximized. In one embodiment, as discussed further below, to enhance heat transfer from die 114, a heat sink is thermally coupled to inactive surface 114U, e.g., with a thermal interface material (TIM).

In another embodiment, protruding surfaces 122, annular surface 124 and inactive surface 114U collectively define a pedestal structure 132 that protrudes upwards from principal surface 120P and away from substrate 102. Pedestal structure 132 allows a very controlled bond line thickness (BLT) for thermal interface material (TIM) dispense and lid/heat sink attach by producing inactive surface 114U of die 114 above principal surface 120P of mold cap 120. This insures good thermal dissipation from die 114.

Figure 3:
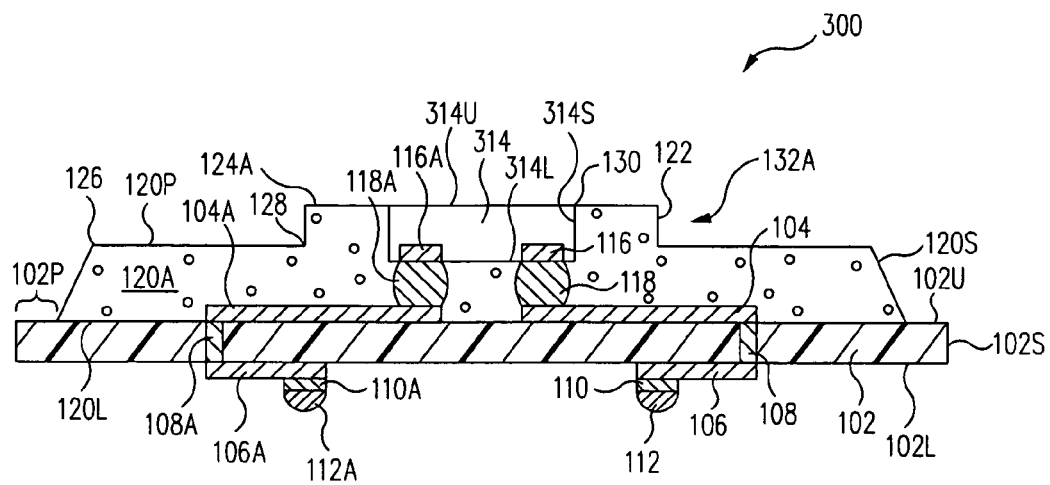
FIG. 3 is a cross-sectional view of an exposed die overmolded flip chip package in accordance with another embodiment of the present invention.

FIG. 3 is a cross-sectional view of an exposed die overmolded flip chip package 300 in accordance with another embodiment of the present invention. Package 300 of FIG. 3 is similar to package 100 of FIGS. 1, 2 and only the significant differences are discussed below.

Referring now to FIGS. 2 and 3 together, package 300 includes a die 314 having an active surface 314L, an inactive surface 314U, and sides 314S. Die 314 of package 300 is smaller than die 114 of package 100. State another way, the total area of active surface 314L of die 314 is less than the total area of active surface 114L of die 114.

However, the overall shape of package 300 is essentially the same or identical to the shape of package 100. Specifically, a pedestal structure 132A of package 300 is essentially the same or identical to pedestal structure 132 of package 100. Specifically, the area reduction of inactive surface 314U of die 314 relative to inactive surface 114U of die 114 is offset by a corresponding area increase in an annular surface 124A of mold cap 120A of package 300 relative to annular surface 124 of mold cap 120 of package 100. Of importance, the same mold can be used to form packages 100, 300 thus minimizing the time and cost to overmold different size dies.

Figure 4:
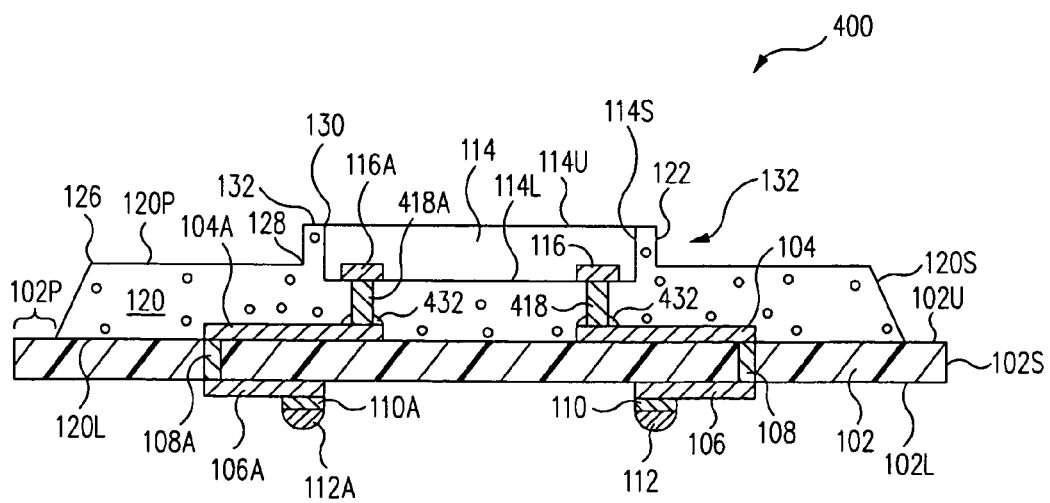
FIG. 4 is a cross-sectional view of an exposed die overmolded flip chip package in accordance with another embodiment of the present invention.

FIG. 4 is a cross-sectional view of an exposed die overmolded flip chip package 400 in accordance with another embodiment of the present invention. Package 400 of FIG. 4 is similar to package 100 of FIGS. 1, 2 and only the significant differences are discussed below.

Referring now to FIG. 4, package 400 includes electrically conductive copper posts 418. Die 114 is mounted to substrate 102 by copper posts 418, which include a first copper post 418A. More particularly, copper posts 418, sometimes called copper pillars, electrically and physically connected bond pads 116 to upper traces 104 thus physically and electrically connecting die 114 to substrate 102. To illustrate, bond pad 116A is electrically and physically connected to upper trace 104A by copper post 418A.

In accordance with one embodiment, copper posts 418 are cylindrically shaped structures formed directly on bond pads 116 of die 114, although are formed in other shapes in other embodiments. Copper posts 418 are attached (bonded) to upper traces 104 by solder joints 432.

In one embodiment, solder joints 432 are a dual particle distribution solder, sometimes called a variable melting point solder, e.g., Sn5 wt % Bi. The first particle distribution is a low melt solder which allows copper post 418 to be tacked to upper traces 104 by solder joints 432 at a relatively low temperature. The second particle distribution is a high melt solder which cures during the molding operation that forms mold cap 120 thus completing the mounting of copper posts 418 to upper traces 104 by solder joints 432. In another embodiment, solder joints 432 are formed of a single particle distribution solder which allows copper post 418 to be mounted to upper traces 104 by solder joints 432 prior to the molding operation that forms mold cap 120.

In one embodiment, a high clamping pressure of the upper mold half on inactive surface 114U of die 114 is used to ensure that epoxy molding compound does not leak over and cover inactive surface 114U of die 114, i.e., to ensure that flash is not formed over inactive surface 114U of die 114. As copper posts 418 are harder and have a higher melting point than solder, copper posts 418 withstand the higher clamping pressure without collapse.

Figure 5:
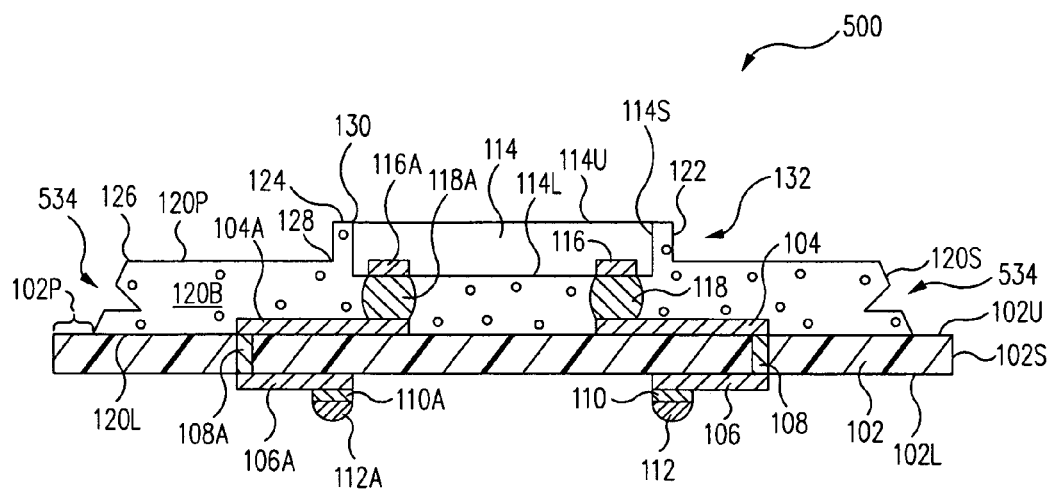
FIG. 5 is a cross-sectional view of an exposed die overmolded flip chip package in accordance with another embodiment of the present invention.

FIG. 5 is a cross-sectional view of an exposed die overmolded flip chip package 500 in accordance with another embodiment of the present invention. Package 500 of FIG. 5 is similar to package 100 of FIGS. 1, 2 and only the significant differences are discussed below.

Referring now to FIG. 5, a mold cap 120B includes sidewalls 120S that include a snapping feature 534. In accordance with this embodiment, snapping feature 534 is a V-shaped channel formed in sidewalls 120S. As discussed further below in reference to FIG. 6, a heat sink is snapped (attached) to package 500 using snapping feature 534.

Figure 6:
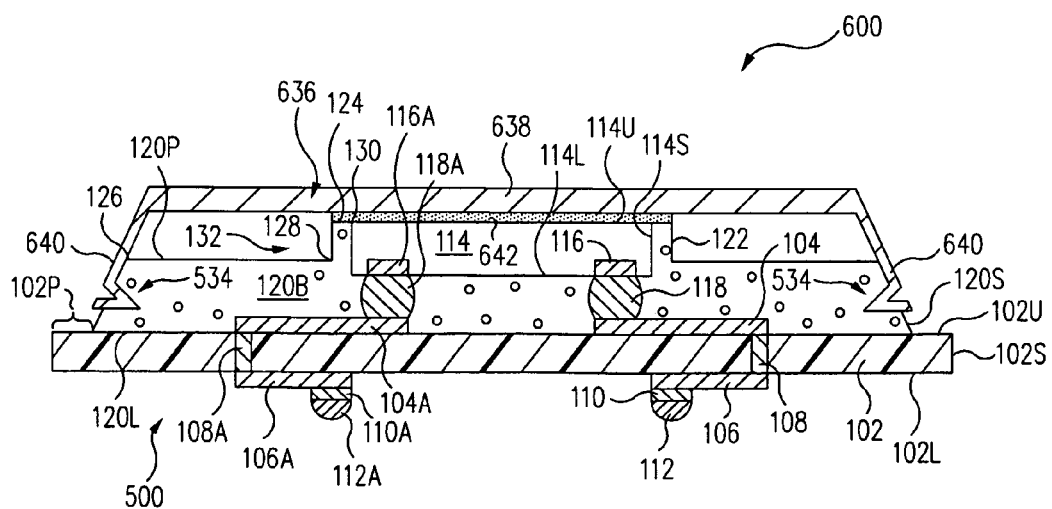
FIG. 6 is a cross-sectional view of a heat sink overmolded flip chip package in accordance with another embodiment of the present invention.

FIG. 6 is a cross-sectional view of a heat sink overmolded flip chip package 600 in accordance with another embodiment of the present invention. Heat sink overmolded flip chip package 600 includes exposed die overmolded flip chip package 500 of FIG. 5 and a heat sink 636 mounted to mold cap 120B.

Referring now to FIG. 6, heat sink 636 includes a core 638 and tabs 640 extending from core 638. Tabs 640 are resilient flexible members that are snapped into snapping feature 534 of mold cap 120B thus locking heat sink 636 to exposed die overmolded flip chip package 500. Mold cap 120B has a sufficient rigidity to facilitate secure snapping of tabs 640 to snapping feature 534.

As shown in FIG. 6, heat sink 636 is in thermal contact with inactive surface 114U of die 114. In accordance with this embodiment, a thermal interface material 642, e.g., thermal grease or adhesive, is interposed between heat sink 636 and inactive surface 114U of die 114 to enhance heat transfer from die 114 to heat sink 636. As set forth above, pedestal structure 132 facilitates very controlled bond line thickness of thermal interface material 642. However, in another embodiment, heat sink 636 directly contacts inactive surface 114U of die 114 and thermal interface material 642 is not used.

Figure 7:
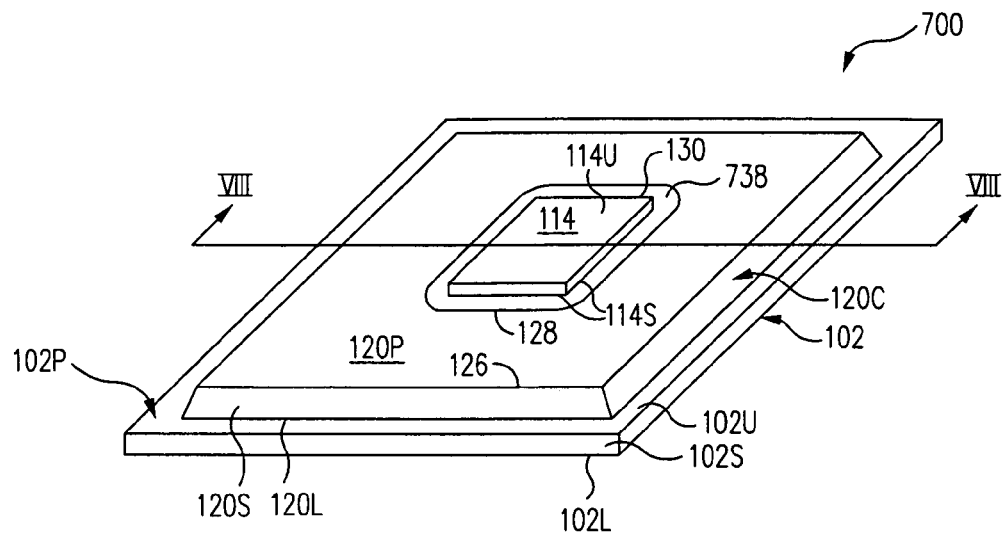
FIG. 7 is a perspective view of an exposed die overmolded flip chip package in accordance with another embodiment of the present invention.
Figure 8:
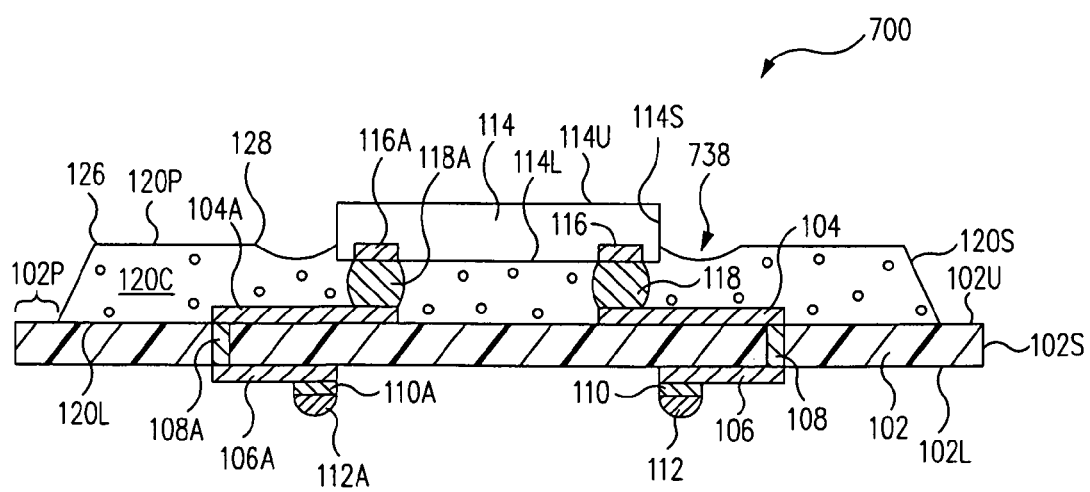
FIG. 8 is a cross-sectional view of the exposed die overmolded flip chip package along the line VIII-VIII of FIG. 7.

FIG. 7 is a perspective view of an exposed die overmolded flip chip package 700 in accordance with another embodiment of the present invention. FIG. 8 is a cross-sectional view of exposed die overmolded flip chip package 700 along the line VIII-VIII of FIG. 7. Package 700 of FIGS. 7, 8 is similar to package 100 of FIGS. 1, 2 and only the significant differences are discussed below.

Referring now to FIGS. 7 and 8 together, a mold cap 1200 includes a moat 738 surrounding die 114. More particularly, moat 738 is a channel, sometimes called recess, in principal surface 120P adjacent die 114.

Moat 738 extends outwards from sides 114S of die 114. In accordance with this embodiment, inactive surface 114U as well as a portion of sides 114S of die 114 are exposed from mold cap 120C. Accordingly, heat transfer from die 114 to the ambient environment is maximized. Further, moat 738 and die 114 provide an interlock surface for an adhesive type thermal interface material and a relief surface to ensure thin bond line thickness of the thermal interface material.

Figure 9:
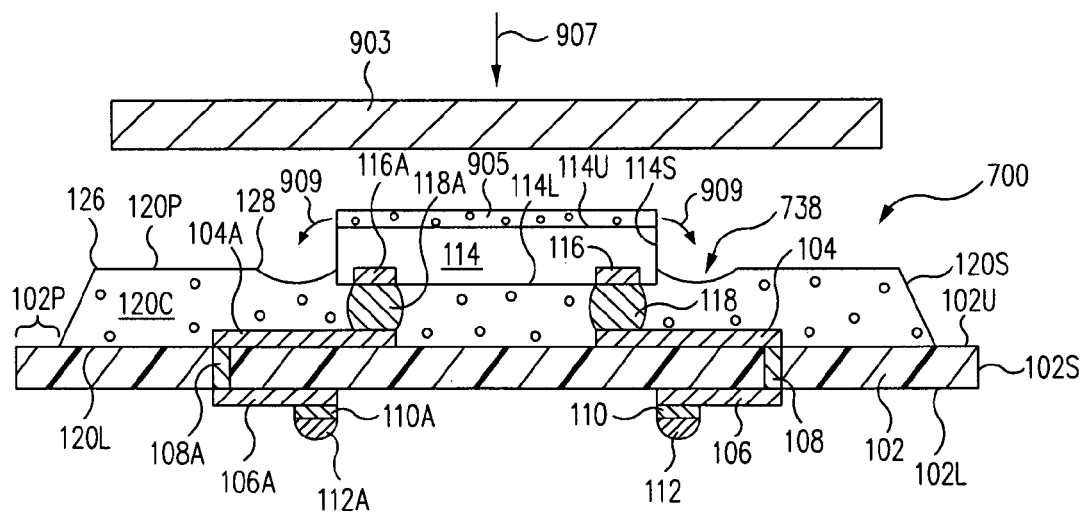
FIG. 9 is a cross-sectional view of a heat sink being assembled to the exposed die overmolded flip chip package of FIG. 7 in accordance with one embodiment.

Further, moat 738 provides a reservoir for capture of access thermal interface material squeezed out from between inactive surface 114U of die 114 and the lid/heat sink thermally coupled to die 114 as discussed in greater detail with respect to FIG. 9.

FIG. 9 is a cross-sectional view of a heat sink 903 being assembled to exposed die overmolded flip chip package 700 of FIGS. 7, 8 in accordance with one embodiment. Referring now to FIG. 9, a thermal interface material 905 is applied to inactive surface 114U of die 114 (or to a lower surface of heat sink 903). Heat sink 903 is moved in the direction of arrow 907 and pressed into thermal interface material 905. Excess thermal interface material 905 is squeezed out from between heat sink 903 and die 114 and into moat 738 as indicated by the arrows 909. Thermal interface material 905, e.g., an adhesive type thermal interface material, is cured thus mounting heat sink 903 to inactive surface 114U of die 114.

Figure 10:
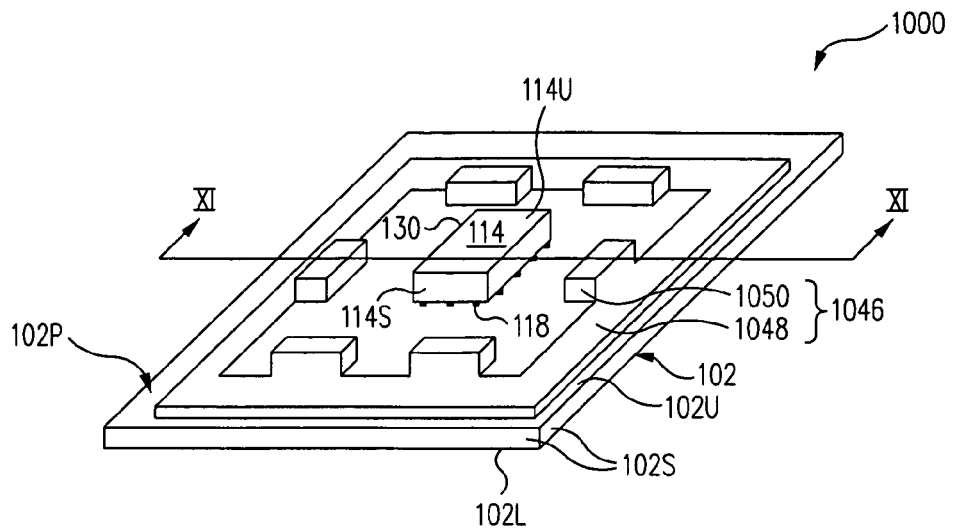
FIG. 10 is a perspective view of an exposed die overmolded flip chip package during fabrication in accordance with one embodiment of the present invention.
Figure 11:
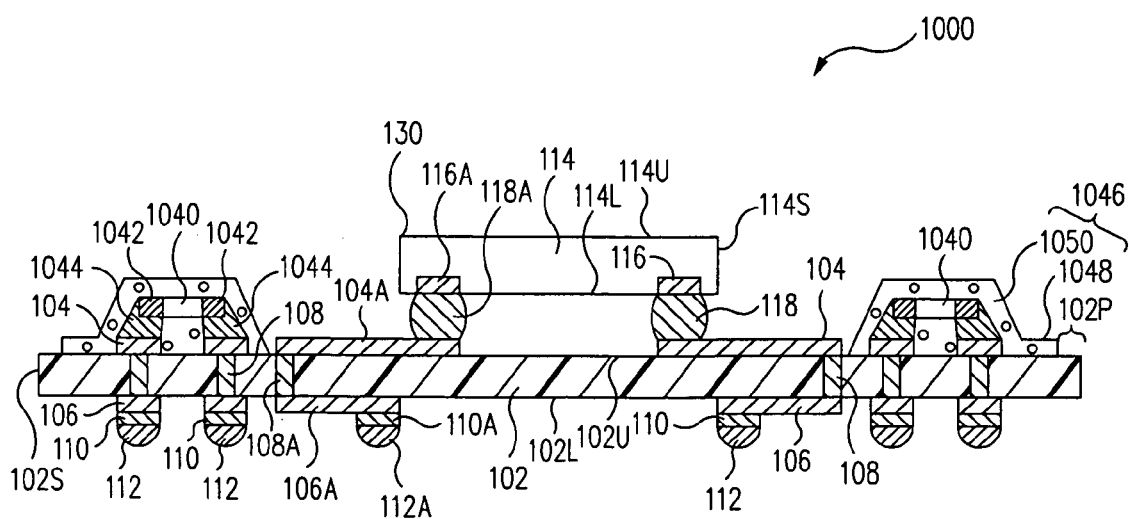
FIG. 11 is a cross-sectional view of the exposed die overmolded flip chip package along the line XI-XI of FIG. 10.

FIG. 10 is a perspective view of an exposed die overmolded flip chip package 1000 during fabrication in accordance with one embodiment of the present invention. FIG. 11 is a cross-sectional view of exposed die overmolded flip chip package 1000 along the line XI-XI of FIG. 10. Exposed die overmolded flip chip package 1000 of FIGS. 10 and 11 is similar to exposed die overmolded flip chip package 100 of FIGS. 1 and 2 and only the significant differences are discussed below.

Referring now to FIGS. 10 and 11 together, in accordance with this embodiment, at least one passive component 1040, e.g., a resistor, capacitor or inductor, is mounted to substrate 102. More particularly, terminals 1042 of passive components 1040 are mounted to upper traces 104 by solder joints 1044.

After mounting of passive components 1040, a stiffener 1046 is formed on upper surface 102U of substrate 102. In accordance with this embodiment, stiffener 1046 is formed by molding in a manner similar to the molding operation discussed above. Stiffener 1046 stiffens substrate 102 thus minimizing flexing, bending, or warping of exposed die overmolded flip chip package 1000. Use of stiffener 1046 also allows substrate 102 to have a minimal thickness.

Stiffener 1046 includes a rectangular annular ring 1048 on upper surface 102U adjacent sides 102S of substrate 102 in accordance with this embodiment. More particularly, periphery 102P of upper surface 102U of substrate is exposed, and ring 1048 if formed directly adjacent periphery 102P.

Stiffener 1046 further includes at least one interlock feature 1050 protruding upward from ring 1048 and away from substrate 102. Interlock features 1050 are features which enhance the interlocking (bonding) of the mold cap to stiffener 1046 as discussed further below in reference to FIG. 12. Stated another way, interlock features 1050 increase the surface area of stiffener 1046 as compared to the surface area of ring 1048 alone. In this manner, the area of contact between stiffener 1046 and the mold cap is increased thus increasing the bonding between stiffener 1046 and the mold cap.

Further, passive components 1040 and solder joints 1044 are covered (encapsulated) in interlock features 1050 of stiffener 1046. Accordingly, stiffener 1046 minimizes stress on solder joints 1044, e.g., stress due to differential thermal expansion between passive components 1040 and substrate 102, sometimes called a mismatch in the thermal coefficients of expansion (TCEs) of passive components 1040 and substrate 102. Further, stiffener 1046 physically mounts passive components 1040 to substrate 102 further minimizing stress on solder joints 1044. Further, stiffener 1046 protects solder joints 1044 from the ambient environment, e.g., from moisture and the associated corrosion of solder joints 1044. Accordingly, stiffener 1046 enhances the reliability of solder joints 1044 and generally the reliability of exposed die overmolded flip chip package 1000.

In accordance with this embodiment, interlock features 1050 are substantially rectangular blocks on upper surface 102U of substrate 102 covering passive components 1040 although are formed in other shapes in other embodiments. In yet another embodiment, stiffener 1046 is formed without interlock features 1050.

Figure 12:
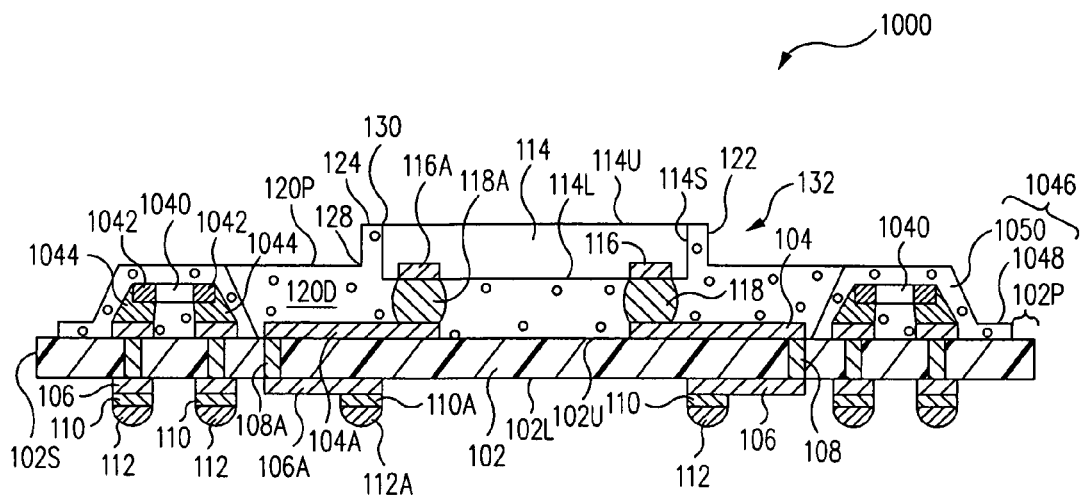
FIG. 12 is a cross-sectional view of the exposed die overmolded flip chip package of FIG. 11 at a further stage during fabrication.

FIG. 12 is a cross-sectional view of exposed die overmolded flip chip package 1000 of FIGS. 10, 11 at a further stage during fabrication. As shown in FIG. 12, a mold cap 120D is formed by molding to overmold die 114. As is well known to those of skill in the art, epoxy molding compounds contain fillers, for instance, silica powder, alumina, silicon nitride, manganese oxide, calcium carbonate, titanium white, and the like. In one example, larger particle size fillers produce stiffer epoxy molding compounds. Conversely, smaller particle size fillers produce epoxy molding compounds with a better ability to fill small spaces.

In accordance with this embodiment, stiffener 1046 is formed of a first epoxy molding compound and mold cap 120D is formed of a second different epoxy molding compound. The first epoxy molding compound of stiffener 1046 has a larger particle size filler than the second different epoxy molding compound of mold cap 120D. Accordingly, stiffener 1046 stiffens package 1000 while mold cap 120D fills the space between active surface 114L of die 114 and upper surface 102U of substrate 102.

In one embodiment, mold cap 120D is formed of an epoxy molding compound having a thermal coefficient of expansion (TCE) between 8 ppm/° C. (parts per million per degree C.) and 35 ppm/° C., and a glass transition temperature (Tg) between 100° C. and 200° C.

In one embodiment, a method includes: 1) mounting of passive components 1040 to substrate 102; 2) forming stiffener 1046 by molding; 3) flip chip mounting die 114 to substrate 102; and 4) forming mold cap 120D by molding.

Figure 13:
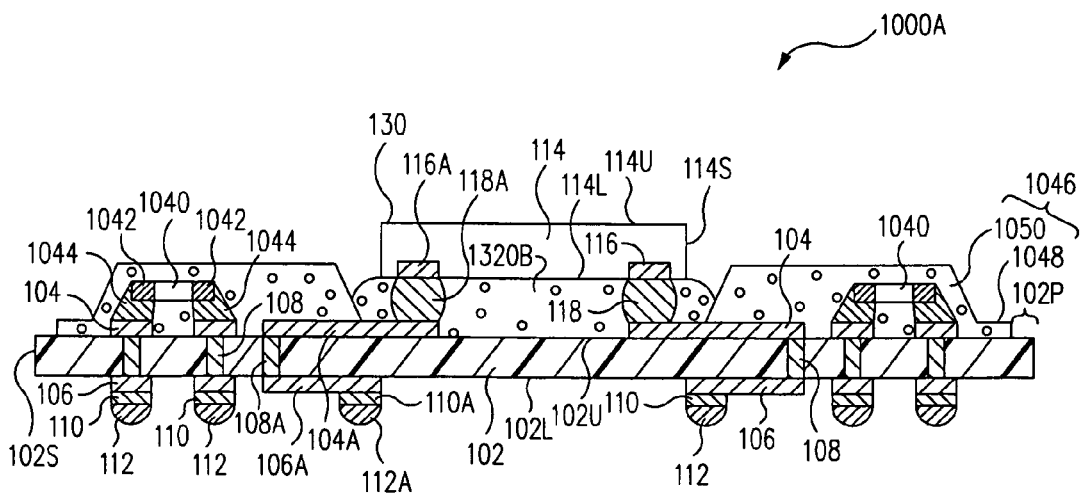
FIG. 13 is a cross-sectional view of an exposed die overmolded flip chip package similar to the exposed die overmolded flip chip package of FIGS. 10, 11 at a further stage during fabrication in accordance with an alternative embodiment.

FIG. 13 is a cross-sectional view of an exposed die overmolded flip chip package 1000A similar to exposed die overmolded flip chip package 1000 of FIGS. 10, 11 at a further stage during fabrication in accordance with an alternative embodiment. As shown in FIG. 13, die 114 is underfilled with an underfill 1320B, e.g., by capillary underfilling. Illustratively, an underfill material is applied around die 114 at the space between die 114 and substrate 102. The underfill material is drawn under die 114 and around flip chip bumps 118 and generally fills the space between active surface 114L of die 114 and upper surface 102U of substrate 102. The underfill material is cured forming underfill 1320B around flip chip bumps 118 and filling the space between active surface 114L of die 114 and upper surface 102U of substrate 102.

Figure 14:
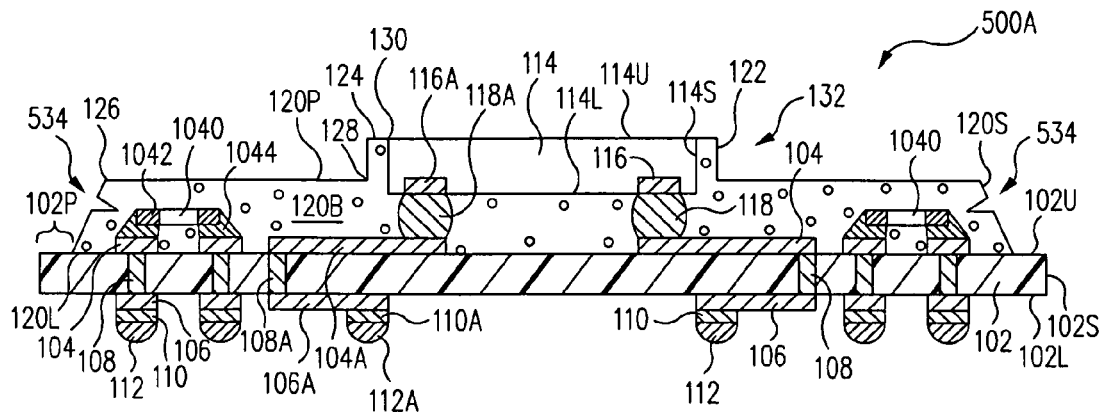
FIG. 14 is a cross-sectional view of an exposed die overmolded flip chip package in accordance with another embodiment of the present invention.

FIG. 14 is a cross-sectional view of an exposed die overmolded flip chip package 500A in accordance with another embodiment of the present invention. Package 500A of FIG. 14 is similar to package 500 of FIG. 5 and only the significant differences are discussed below.

In accordance with this embodiment, passive components 1040 are mounted to substrate 102 by solder joints 1044 in a manner similar to that discussed above in regards to exposed die overmolded flip chip package 1000 of FIGS. 10 and 11, and so the discussion is not repeated here. Generally, passive components 1040 can be mounted to substrate 102 in a manner similar to that illustrated in FIG. 14 in any of the embodiments set forth herein, e.g., in the embodiments illustrated in FIGS. 1-9, 15-16.

Referring still to FIG. 14, passive components 1040 are overmolded, sometimes called enclosed, in mold cap 120B. As passive components 1040 are mounted to substrate 102 and overmolded in mold cap 120B, passive components 1040 anchor (hold) mold cap 120B to substrate 102.

Further, passive components 1040 and solder joints 1044 are covered (encapsulated) in mold cap 120B. Accordingly, mold cap 120B minimizes stress on solder joints 1044, e.g., stress due to differential thermal expansion between passive components 1040 and substrate 102. Further, mold cap 120B physically mounts passive components 1040 to substrate 102 further minimizing stress on solder joints 1044. Further, mold cap 120B protects solder joints 1044 from the ambient environment, e.g., from moisture and the associated corrosion of solder joints 1044. Accordingly, mold cap 120B enhances the reliability of solder joints 1044 and generally the reliability of exposed die overmolded flip chip package 500A.

Figure 15:
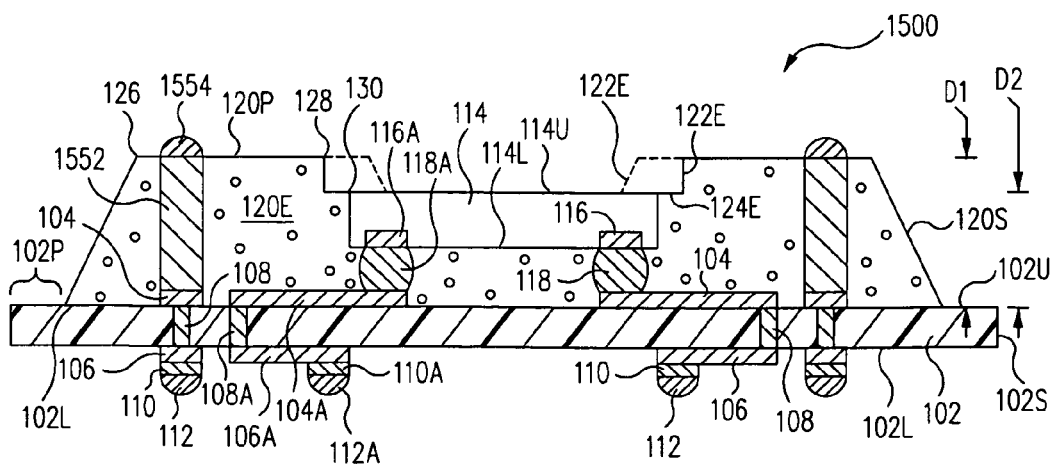
FIG. 15 is a cross-sectional view of an exposed die overmolded flip chip package in accordance with another embodiment of the present invention.

FIG. 15 is a cross-sectional view of an exposed die overmolded flip chip package 1500 in accordance with another embodiment of the present invention. Package 1500 of FIG. 15 is similar to package 100 of FIGS. 1, 2 and only the significant differences are discussed below.

Referring now to FIG. 15, inactive surface 114U of die 114 is recessed from a mold cap 120E. In accordance with this embodiment, principal surface 120P of mold cap 120E is spaced a first distance D1 from upper surface 102U of substrate 102. Further, inactive surface 114U of die 114 is spaced a second distance D2 from upper surface 102U of substrate 102. Distance D2 of inactive surface 114U from upper surface 102U is less than distance D1 of principal surface 120P from upper surface 102U, i.e., principal surface 120P is at a greater height from upper surface 102U of substrate 102 than inactive surface 114U.

Principal surface 120P extend inwards from sidewalls 120S to receding surfaces 122E of mold cap 120E. Receding surfaces 122E extend from principal surface 120P perpendicularly downward and towards substrate 102. More particularly, receding surfaces 122E extend perpendicularly between principal surface 120P and an annular surface 124E. Although receding surfaces 122E are perpendicular to principal surface 120P and annular surface 124E in accordance with this embodiment, in other embodiments, receding surfaces 122E slant inward or outward from principal surface 120P.

Annular surface 124E is coplanar, i.e., lies in a common plane, with inactive surface 114U of die 114. More particular, annular surface 124E is spaced apart by distance D2 from upper surface 102U of substrate 102.

In another embodiment, mold cap 120E is formed without annular surface 124E. As indicated by the dashed lines, in accordance with this embodiment, receding surfaces 122E slant inward directly on to inactive surface 114U of die 114. Thus, a periphery of inactive surface 114U is enclosed in mold cap 120E, and a central region of inactive surface 114U is exposed.

Further, in accordance with this embodiment, a plurality of electrically conductive vias 1552 extend through mold cap 120E from substrate 102 to principal surface 120P. Vias 1552 are electrically connected to upper traces 104 of substrate 102. Interconnection balls 1554 are formed on vias 1552 at principal surface 120P in accordance with this embodiment.

Illustratively, exposed die overmolded flip chip package 1500 is a lower package of a package-on-package (POP) structure, and the upper package is electrically connected to exposed die overmolded flip chip package 1500 by reflow of interconnection balls 1554.

Illustratively, vias 1552 are formed by forming openings through mold cap 120E, e.g., with laser ablation, mechanical drilling, chemical etching, or other technique. The openings are filled with an electrically conductive material, e.g., using a plating and etching operation, to form vias 1552. Further, in another embodiment, the openings are formed through both mold cap 120E and substrate 102 such that vias 1552 extend through mold cap 120E and substrate 102 to lower surface 102L of substrate 102.

Although not illustrated above, electrically conductive vias 1552 and interconnection balls 1554 can be formed in any of the embodiments set forth herein.

Figure 16:
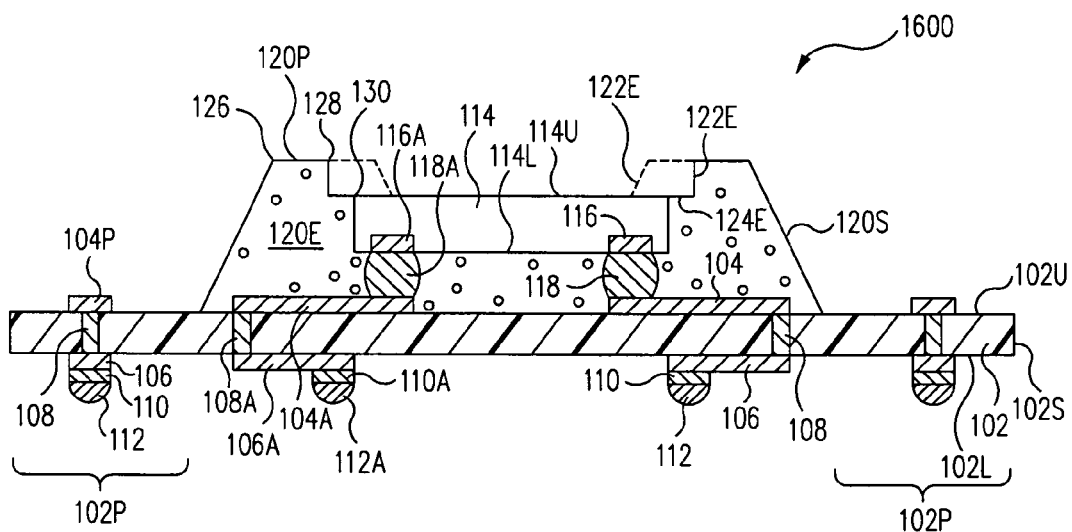
FIG. 16 is a cross-sectional view of an exposed die overmolded flip chip package in accordance with another embodiment of the present invention.

FIG. 16 is a cross-sectional view of an exposed die overmolded flip chip package 1600 in accordance with another embodiment of the present invention. Package 1600 of FIG. 16 is similar to package 1500 of FIG. 15 and only the significant differences are discussed below.

Referring now to FIG. 16, peripheral upper traces 104P of upper traces 104, e.g., a subset of upper traces 104, are formed on periphery 102P of upper surface 102U of substrate 102. Periphery 102P of upper surface 102U is adjacent sides 102S of substrate 102 and is uncovered (not covered) by mold cap 120E and exposed and the remaining central portion of upper surface 102U of substrate is enclosed within mold cap 120E. Accordingly, peripheral upper traces 104P form exposed lands which are uncovered by mold cap 120E.

Illustratively, exposed die overmolded flip chip package 1600 is a lower package of a package-on-package (POP) structure, and the upper package is electrically connected to exposed die overmolded flip chip package 1600 by peripheral upper traces 104P. For example, the upper package includes peripheral solder balls or other interconnection structures protruding downward. These solder balls have a height sufficient to allow the solder balls to be reflowed (attached) to peripheral upper traces 104P while spacing the remainder of the upper package above mold cap 120E.

Although not illustrated above, peripheral upper traces 104P can be formed in any of the embodiments set forth herein.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of fabricating an exposed die overmolded flip chip package comprising:
    flip chip mounting a die to a first surface of a substrate;
    forming a mold cap using a molding process, the mold cap comprising:
        a principal surface exposed directly to the ambient environment;
        sidewalls extending from the first surface of the substrate to the principal surface;
        an annular surface coplanar with an inactive surface of the die and extending outward from a peripheral edge of the inactive surface of the die; and
        protruding surfaces extending between the principal surface and the annular surface,
    wherein the protruding surfaces, annular surface and inactive surface of the die collectively define a pedestal structure that protrudes from the principal surface away from the substrate.

2. A method of fabricating an exposed die overmolded flip chip package comprising:
    flip chip mounting a die to a first surface of a substrate, the die comprising:
        an active surface;
        an inactive surface opposite the active surface; and
        bond pads on the active surface; and
    forming a mold cap, the mold cap filling a space between the active surface of the die and the first surface of the substrate, a height of the inactive surface of the die from the first surface of the substrate being greater than a height of the entire mold cap from the first surface of the substrate such that the entire inactive surface of the die is exposed directly to the ambient environment from the mold cap in the final assembly of the exposed die overmolded flip chip package, wherein the mold cap comprises a moat surrounding the die, the moat being directly exposed to the ambient environment.

3. The method of claim 2 wherein the mold cap comprises sidewalls extending from the first surface of the substrate to a principal surface of the mold cap.

4. The method of claim 2 wherein the flip chip mounting comprises physically and electrically connecting the bond pads of the die to first traces on the first surface of the substrate.

5. The method of claim 4 wherein the bond pads of the die are physically and electrically connected to the first traces by solder bumps.

6. The method of claim 4 wherein the bond pads of the die are physically and electrically connected to the first traces by copper posts.

7. The method of claim 6 further comprising solder joints bonding the copper posts to the first traces.

8. The method of claim 2 wherein the moat comprises a channel in a principal surface of the mold cap.

9. The method of claim 2 wherein the die comprises sides extending between the active surface and the inactive surface, a portion of the sides of the die being exposed from the mold cap.

10. The method of claim 2 wherein the forming the mold cap comprises using a molding process.

11. The method of claim 10 wherein the using a molding process comprises placing the substrate including the flip chip mounted die in a mold.

12. The method of claim 11 wherein the using a molding process further comprises pressing an upper mold half of the mold on the inactive surface of the die.

13. The method of claim 12 wherein the using a molding process further comprises transferring epoxy molding compound into the mold.

14. The method of claim 13 wherein the using a molding process further comprising removing the exposed die overmolded flip chip package from the mold.

15. A method comprising:
    flip chip mounting a die to a first surface of a substrate, the die comprising:
        an active surface;
        an inactive surface opposite the active surface;

sides extending between the active surface and the inactive surface; and bond pads on the active surface;

forming a mold cap, the mold cap filling a space between the active surface of the die and the first surface of the substrate, a height of the inactive surface of the die from the first surface of the substrate being greater than a height of the entire mold cap from the first surface of the substrate, the mold cap comprising a moat surrounding the die, the moat comprising a channel in a principal surface of the mold cap, the channel being directly exposed to ambient environment, wherein, a portion of the sides of the die are exposed from the mold cap; and transferring heat from the die through the inactive surface directly to the ambient environment.

16. The method of claim 15 wherein the entire inactive surface of the die is exposed directly to the ambient environment from the mold cap in the final assembly.

17. The method of claim 15 wherein the flip chip mounting comprises physically and electrically connecting the bond pads of the die to first traces on the first surface of the substrate.

18. The method of claim 17 wherein the bond pads of the die are physically and electrically connected to the first traces by solder bumps.

19. The method of claim 17 wherein the bond pads of the die are physically and electrically connected to the first traces by copper posts.

20. The method of claim 19 further comprising solder joints bonding the copper posts to the first traces.

* * * * *

UNITED STATES PATENT AND TRADEMARK OFFICE
CERTIFICATE OF CORRECTION

PATENT NO. : 8,207,022 B1
APPLICATION NO. : 12/931326
DATED : June 26, 2012
INVENTOR(S) : Robert F. Darveaux et al.

Page 1 of 1

It is certified that error appears in the above-identified patent and that said Letters Patent is hereby corrected as shown below:

In Column 12, Line 61, Claim 14, replace "comprising" with --comprises--; and
In Column 13, Line 12, Claim 15, between "exposed to" and "ambient", insert --the--.

Signed and Sealed this
Eleventh Day of September, 2012

David J. Kappos
*Director of the United States Patent and Trademark Office*